United States Patent
Odajima et al.

[11] Patent Number: 5,421,902
[45] Date of Patent: Jun. 6, 1995

[54] NON-PLASMA CLEANING METHOD FOR SEMICONDUCTOR MANUFACTURING APPARATUS

[75] Inventors: Hideki Odajima; Chitoshi Nogami, both of Osaka; Masanori Suzuki; Manabu Saeda, both of Moriyama, all of Japan

[73] Assignee: Iwatani Sangyo Kabushiki Kaisha (Iwatani International Corp), Osaka, Japan

[21] Appl. No.: 235,895

[22] Filed: May 2, 1994

[30] Foreign Application Priority Data

Jul. 9, 1993 [JP] Japan .................. 5-194333
Dec. 28, 1993 [JP] Japan .................. 5-333968

[51] Int. Cl.$^6$ ............................................. B08B 7/00
[52] U.S. Cl. .............................. 134/19; 134/1; 134/21; 134/22.1
[58] Field of Search .............. 134/1, 19, 21, 22.1; 118/723 E, 715, 724; 156/643

[56] References Cited
U.S. PATENT DOCUMENTS
4,581,101  4/1986  Senoue et al. .................. 156/643

*Primary Examiner*—Scott Kastler
*Assistant Examiner*—Sean Vincent
*Attorney, Agent, or Firm*—Bacon & Thomas

[57] ABSTRACT

When removing a laminar deposit existing in a thin film forming operational system of a semiconductor manufacturing apparatus, a mixture gas prepared by mixing nitrogen trifluoride gas with a fluoric gas is introduced into the thin film forming operational system so as to be brought into contact in a non-plasma state with the laminar deposit.

2 Claims, 1 Drawing Sheet

NON-PLASMA CLEANING METHOD FOR SEMICONDUCTOR MANUFACTURING APPARATUS

BACKGROUND OF THE INVENTION

1. Field of the Invention

The present invention relates to a cleaning method for removing a laminar deposit formed by an accumulation of polysilicon, amorphous silicon and the like in a thin film forming operational system of a semiconductor manufacturing apparatus and, more particularly, to a cleaning method adapted to clean a thin film forming system of a semiconductor manufacturing apparatus in a non-plasma state.

2. Description of the Prior Art

Conventionally, when cleaning a thin laminar deposit accumulated in a thin film forming operational system of a semiconductor manufacturing apparatus, nitrogen trifluoride gas is used in a plasma state as a cleaning gas or a gas prepared by mixing about 5 vol % of fluorine gas with an inert gas such as helium gas, argon gas and the like is used in a non-plasma state as the cleaning gas.

3. Problems Presented by the Prior Art

However, such a conventional cleaning method employs an etching rate of about 2000~3000 Å/min in the case of a polysilicon laminar deposit and an etching rate of about 900~1200 Å/min in the case of an amorphous sylicon laminar deposit. Further, when employing a plasma etching process, there is also such a problem that a jig and the like might be damaged thereby.

It is an object of the present invention to provide a cleaning method which is capable of removing a laminar deposit at a low temperature and for a short time without damaging a jig and the like.

SUMMARY OF THE INVENTION

For accomplishing the above-mentioned object, the present invention is characterized in that a cleaning gas prepared by mixing nitrogen trifluoride gas with another fluoric gas is brought into contact in a non-plasma state with a laminar deposit existing in a thin film forming operational system. More preferably, the interior of the thin film forming operational system may be held in such an atmosphere as to have a temperature of at least 270° C. and a reduced atmospheric pressure of 0.2~30 Torr (26.7~4000 Pa) while a cleaning gas prepared by mixing 0.1~5 vol % of fluorine gas with nitrogen trifluoride gas may be employed as a cleaning gas.

According to the present invention, since a cleaning gas prepared by mixing the nitrogen trifluoride gas with a fluoric gas is used in the non-plasma state for cleaning the thin film forming operational system, the fluoric gas starts a reaction by acting of the laminar deposit, so that the fluorine component decomposed from the nitrogen trifluoride gas by a reaction heat generated at the time of reaction of the fluoric gas facilitates the cleaning effectively. Therefore, according to the present invention, it becomes possible to shorten a cleaning time so as to enhance the operational rate of the cleaning apparatus under a low temperature condition as well as to save a consumption of the cleaning gas in comparison with the conventional cleaning method.

Further, according to the present invention, since it is possible to carry out a cleaning of a thin film forming operational system in a non-plasma state, jigs and like devices arranged in a thin film forming operational system can be prevented from being damaged during the cleaning.

DETAILED DESCRIPTION OF THE PREFERRED EMBODIMENT

Figure 1:
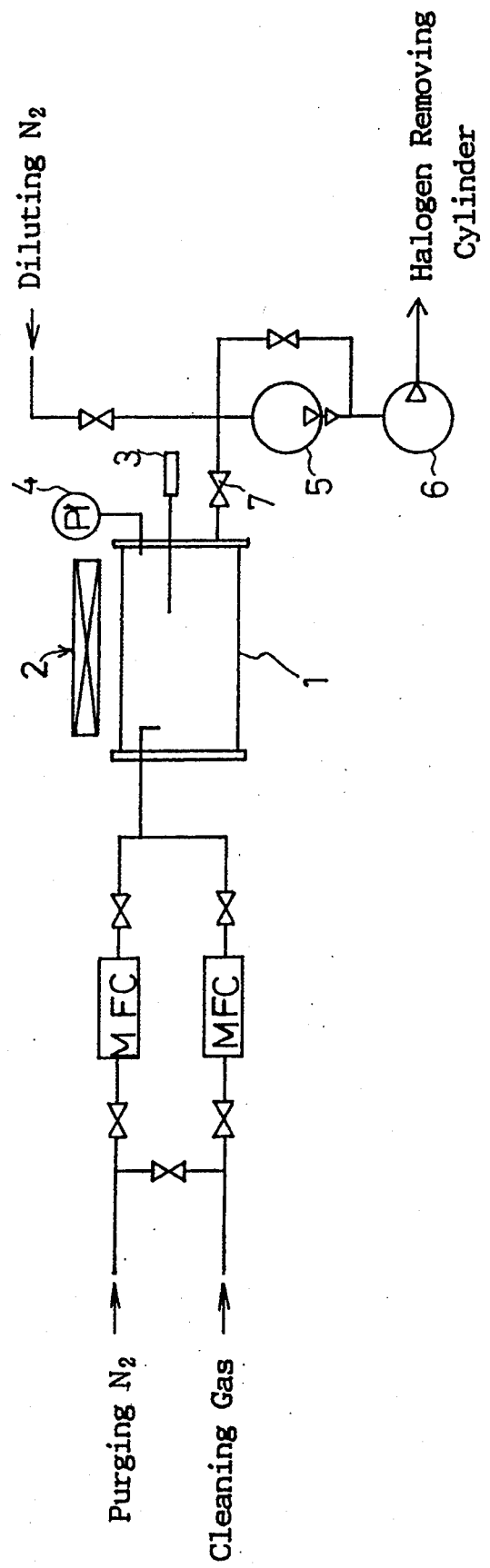
FIG. 1 is a flow chart of an experimental apparatus according to the present invention.

Within a quartz-made chamber (1) of an experimental apparatus as illustrated in FIG. 1, there are arranged two samples each having a thickness of 6000~9000 Å, one of which is formed with polysilicon lamina and the other of which is formed with amorphous silicon lamina. While the quartz-made chamber (1) is heated by a halogen lamp (2), a cleaning is carried out without generating any plasma by using a mixture gas containing 95 vol % of nitrogen trifluoride gas and 5 vol % of a fluoric gas such as, for example fluorine gas as a cleaning gas.

In FIG. 1, numeral (3) designates a thermocouple for detecting a temperature of an interior of the chamber (1), numeral (4) does a pressure gauge for indicating a pressure within the chamber (1), numeral (5) does a booster pump for performing a vacuum suction throughout an experimental system, numeral (6) does a rotary pump for discharging an exhaust gas to a halogen removing cylinder (not illustrated) disposed outside the experimental system, and numeral (7) does an outlet valve disposed at an outlet of the chamber (1).

According to an experimental method, after a gas cylinder which stores the cleaning gas has been connected to the experimental apparatus and the experimental system has been purged sufficiently by nitrogen gas, the booster pump (5) is operated so as to evacuate an interior of the experimental system. Then, after the nitrogen gas has been introduced into the chamber (1) so as to have the atmospheric pressure therein, the chamber (1) is opened to place the samples therein. After the placement of the samples, the interior of the chamber (1) is purged by the nitrogen gas and subsequently a pressure reduction therein is effected to attain a vacuum degree of 0.01 Torr (1.33 Pa). After that, the chamber (1) is heated by the halogen lamp (2) to have desired temperatures therein. Under this condition, the nitrogen gas is introduced into the chamber (1) at the rate of 1 liter/min so that a pressure within the chamber (1) becomes desired pressures by regulating the outlet valve (7). Then, the nitrogen gas is replaced with the cleaning gas so hat the cleaning gas can be brought into contact with the samples placed within the chamber (1). A thickness of the lamina of each sample is measured after completion of the experiment so as to be compared with a thickness of the lamina before commencement of the experiment.

As comparative examples, cleaning rates attained by using a mixture gas prepared by mixing 5 vol % of the fluorine gas with 95 vol % of helium gas and 100% of the nitrogen trifluoride gas as the cleaning gas respectively are shown in Table-1.

TABLE 1

| Lamina | Gas | Press. Torr | Temp. °C. | Flow SCCM | Cleaning Rate Å/min |
| --- | --- | --- | --- | --- | --- |
| Polysilicon | 5% F$_2$ + 95% He | 30 | 420 | 5000 | 2500~3000 |
|  | 100% NF$_3$ | 30 | 420 | 5000 | 1500~2000 |
|  | 5% F$_2$ + | 30 | 420 | 5000 | 7500~8000 |

TABLE 1-continued

| Lamina | Gas | Press. Torr | Temp. °C. | Flow SCCM | Cleaning Rate Å/min |
|---|---|---|---|---|---|
| Amorphous Silicon | 95% NF$_3$ 5% F$_2$ + 95% He | 0.8 | 300 | 1000 | 60~70 |
| | 100% NF$_3$ | 0.8 | 300 | 1000 | 0 |
| | 5% F$_2$ + 95% NF$_3$ | 0.8 | 300 | 1000 | 60~70 |
| | 5% F$_2$ + 95% He | 0.8 | 350 | 1000 | 900~1200 |
| | 100% NF$_3$ | 0.8 | 350 | 1000 | 0 |
| | 5% F$_2$ + 95% NF$_3$ | 0.8 | 350 | 1000 | 1400~1900 |

When considering the above-mentioned results, the cleaning rate in the case of the cleaning gas prepared by mixing the fluorine gas with the nitrogen trifluoride gas according to the present invention can be made 1.5~4 times as rapid as that in the case of the conventional cleaning gas used at the temperature not lower than 350° C. in the non-plasma state.

Incidentally, in order to investigate influences of an atmospheric temperature within the chamber (1) upon the cleaning rate (Å/min), changes of the cleaning rate caused by changes of the atmospheric temperature are shown in Table-2. In this case, the flow rate of the gas is set to 500 SCCM and the pressure within the chamber is set to 10 Torr (1333.2 Pa).

TABLE 2

| Atmospheric Temp. | 200° C. | 270° C. | 300° C. | 330° C. |
|---|---|---|---|---|
| 5% F$_2$ + 95% He | 366 | 359 | 753 | 1173 |
| 100% NF$_3$ | <10 | <10 | <10 | <10 |
| 5% F$_2$ + 95% NF$_3$ | 396 | 737 | 1196 | 1529 |

In order to investigate influences of an concentration of the fluorine gas upon the cleaning rate (Å/min), a concentration of fluorine gas is changed. Changes of the cleaning rate at that time are shown in Table-3. In this case, the temperature of the interior of chamber is set to 330° C., the flow rate of the gas is set to 500 SCCM and the pressure within the chamber is set to 10 Torr (1333.2 Pa).

TABLE 3

| Concentration of F$_2$ (%) | Ar Atmosphere | NF$_3$ Atmosphere |
|---|---|---|
| 0.05 | <10 | <10 |
| 0.1 | 11 | 49 |
| 0.5 | 52 | 111 |
| 5 | 1173 | 1529 |

Further, in order to investigate influences of the pressure within the chamber upon the cleaning rate (Å/min), the pressure within the chamber is changed. Changes of the cleaning rate at that time are shown in Table-4. In this case, the temperature of the interior of the chamber is set to 330° C. and the flow rate of the gas is set to 500 SCCM.

TABLE 4

| Pressure (Torr) | 5% F$_2$ + 95% Ar | 5% F$_2$ + 95% NF$_3$ |
|---|---|---|
| 0.1 | <10 | <10 |
| 0.2 | 152 | 264 |
| 0.5 | 350 | 701 |
| 1.0 | 549 | 1171 |
| 10 | 1173 | 1529 |

According to the above-mentioned results, it can be clearly understood that the cleaning rate increases under such a condition that the atmospheric temperature is not lower than 270° C., the concentration of fluorine gas is not less than 0.1 vol % and the pressure within the chamber is not lower than 0.2 Torr (26.7 Pa).

What is claimed is:

1. A non-plasma method for removing a laminar deposit of polysilicon or amorphous silicon from the interior of a chamber used to manufacture semiconductor devices wherein said method comprises introducing a cleaning gas under non-plasma conditions into said chamber so that said gas contacts said laminar deposit; said cleaning gas consisting essentially of fluorine and nitrogen trifluoride.

2. The method of claim 1 wherein the cleaning gas contains 0.1-5.0 volume % fluorine with the remainder being nitrogen trifluoride and said gas is at a temperature of at least 270° C. and a pressure of 0.2-30 torr.

* * * * *